(12) United States Patent
Kawasaki et al.

(10) Patent No.: US 7,193,908 B2
(45) Date of Patent: Mar. 20, 2007

(54) SEMICONDUCTOR MEMORY

(75) Inventors: Toshiaki Kawasaki, Takatsuki (JP); Masashi Agata, Osaka (JP); Masanori Shirahama, Otsu (JP); Ryuji Nishihara, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 33 days.

(21) Appl. No.: 11/202,230

(22) Filed: Aug. 12, 2005

(65) Prior Publication Data

US 2006/0039209 A1 Feb. 23, 2006

(30) Foreign Application Priority Data

Aug. 19, 2004 (JP) ............................... 2004-239132

(51) Int. Cl.
*G11C 7/00* (2006.01)
(52) U.S. Cl. ........................... 365/189.11; 365/189.07; 365/230.06
(58) Field of Classification Search ........... 365/189.07, 365/189.08, 189.09, 189.11, 230.06, 230.08
See application file for complete search history.

(56) References Cited

U.S. PATENT DOCUMENTS

| 5,610,859 | A | * | 3/1997 | Nakamura et al. | ..... | 365/185.22 |
| 5,761,122 | A | * | 6/1998 | Nakamura et al. | ..... | 365/185.21 |
| 6,297,624 | B1 | * | 10/2001 | Mitsui et al. | ............... | 323/316 |
| 6,384,664 | B1 | | 5/2002 | Hellums et al. | | |

OTHER PUBLICATIONS

Alavi, et al., "A PROM Element Based on Salicide Agglomeration of Poly Fuses in a CMOS Logic Process," IEEE, 1997.

* cited by examiner

*Primary Examiner*—Gene N. Auduong
(74) *Attorney, Agent, or Firm*—McDermott Will & Emery LLP (57) ABSTRACT

Provided is a semiconductor memory, comprising: a voltage converting circuit which voltage-converts a resistance difference between a first and a second resistance elements; a voltage comparing circuit which outputs an output corresponding to the voltage conversion; a latch circuit for holding the output of the voltage comparing circuit; and a switch circuit which cuts and connects the voltage converting circuit and the voltage comparing circuit.

20 Claims, 9 Drawing Sheets

SEMICONDUCTOR MEMORY

BACKGROUND OF THE INVENTION

1. Field of the Invention

The present invention relates to a semiconductor memory and, more particularly, to a semiconductor memory comprising a resistant element such as a silicide blown electric fuse which can be manufactured through a standard CMOS process.

2. Description of the Related Art

In a semiconductor memory with analog trimming or memory redundancy, fuse elements are widely used for achieving the functions. Fabrication of the fuses has become increasingly difficult due to its micronized process so that there has been a demand for developing a substitute technique. For meeting such demand, there is proposed an electric fuse which can be easily manufactured by a standard CMOS process to be used for storing data by using a difference of the resistance before and after blowing silicide.

The related art is disclosed, for example, in U.S. Pat. No. 6,384,664 "DIFFERENTIAL VOLTAGE SENSE CIRCUIT TO DETECT THE STATE OF A CMOS PROCESS COMPATIBLE FUSES AT LOW POWER SUPPLY VOLTAGES" (referred to as a first related art) and "A PROM Element BaseDON Silicide Agglomeratin of Poly Fuses in a MOS Logic Process" IEEE 1997, Mohsen AlaVi et al., (referred to as a second related art).

Figure 10:
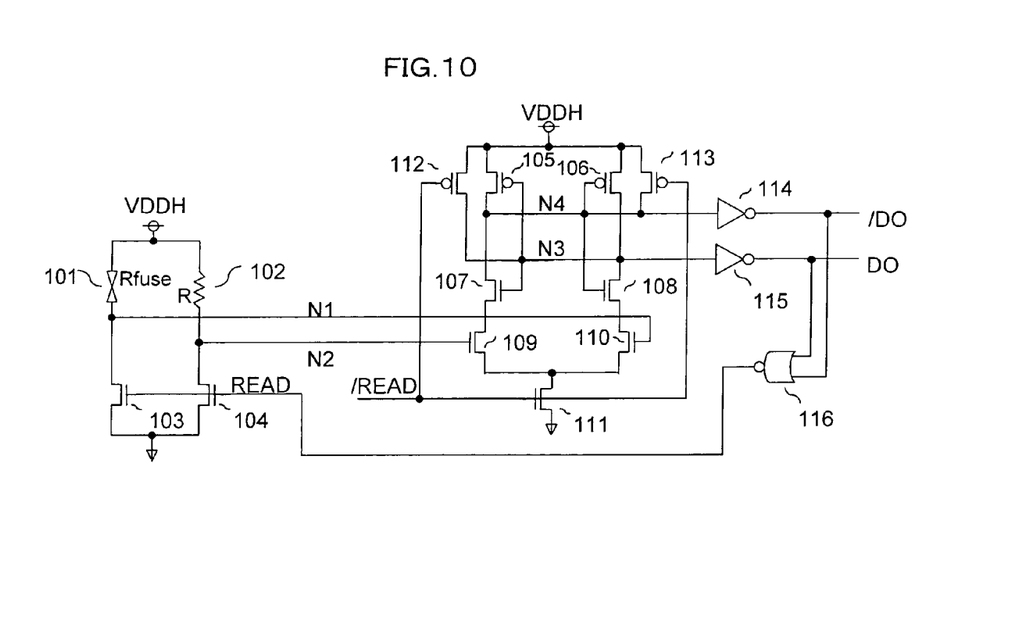
FIG. 10 is a reading-out circuit diagram of a semiconductor memory according to a conventional case.

FIG. 10 shows an exemplifier illustration of the first related art. In FIG. 10, reference numeral 101 is an electric fuse. 102 is a reference resistance as a comparative target of the resistance value of the electric fuse 101. 105, 106, 112, and 113 are PMOS transistors. 107, 108, 109, 110, and 111 are NMOS transistors. 114 and 115 are inverter circuits. 116 is a NOR circuit comprising two inputs.

Between a power source VDDH and GND, the electric fuse 101, the NMOS transistor 103, the reference resistance 102, and the NMOS transistor 104 are disposed, respectively. The PMOS transistors 105, 106 and the NMOS transistors 107, 108 constitute a cross couple. Drains of the NMOS transistors 109, 110 are coupled to sources of the NMOS transistors 107, 108, respectively. The NMOS transistor 111 is disposed between the sources of the NMOS transistor 109, 110 and the GND. The PMOS transistors 112, 113 are disposed between the power source VDDH and cross couple nodes N3, N4. The outputs /DO, DO of the inverter circuits 114, 115 are inputted to the NOR circuit 116. An output signal READ of the NOR circuit 116 is inputted to the NMOS transistors 103, 104.

Figure 11:
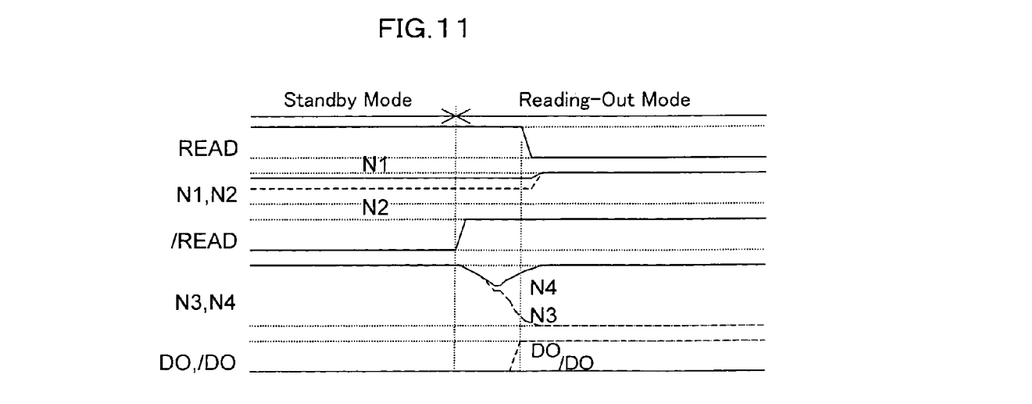
FIG. 11 is a timing chart of a reading out action according to the conventional case.

The operation of the semiconductor memory used in a conventional read-out circuit formed as described above will be described by referring to a timing chart of FIG. 11.

In a standby state where a reading-out action is not performed, /READ is "0" and the NMOS transistor 111 to which the /READ is inputted is in OFF state. The cross couple nodes N3, N4 are pre-charged to VDDH by the PMOS transistors 112, 113. The outputs /DO, DO of the inverter circuits 114, 115 are both "0". Thereby, the output READ of the NOR circuit 116 becomes "1" so that the NMOS transistors 103, 104 are in ON state.

At this time, due to a flow of electric current via the NMOS transistor 103, 104, there is a voltage drop caused in the electric fuse 101 and the reference resistance 102. With this, a voltage N1 at the end part of the electric fuse 101 and a voltage N2 at the end part of the reference resistance 102 come to have an analog voltage value which is lower than the VDDH for the amount of the voltage drop. The voltages N1, N2 are inputted to the gates of the NMOS transistors 109, 110, respectively.

At this time, the reading-out action is started. When the /READ changes from "0" to "1", the PMOS transistors 112, 113 become OFF and the NMOS transistor 111 becomes ON. In that state, both the NMOS transistors 109, 110 are in ON state since the voltages N1, N2 inputted to the gates thereof is lower than the VDDH. Therefore, both cross couple nodes N3, N4 start to discharge from the pre-charge level VDDH to the GND.

The rate of discharge at this time depends on the voltages N1, N2 inputted to the gates of the NMOS transistors 109, 110 and the size of device. For example, in the case where the electric fuse 101 is not blown (having the initial resistance value), the voltage drop by the electric fuse 101 is smaller than he voltage drop by the reference resistance 102. Thus, it becomes (N1>N2). Therefore, the capacity of having the flow of the electric current becomes higher in the NMOS transistor 110 which has the voltage N1 inputted to its gate than in the NMOS transistor 109 which has the voltage N2 inputted to its gate. Accordingly, the cross couple node N3 is discharged faster than the cross couple node N4. As a result, there is a small voltage difference generated between both cross couple nodes N3, N4. The small voltage difference is amplified and, at last, the CMOS voltage level of the cross couple node N3 becomes "0" and that of the cross couple node N4 becomes "1".

Now, let's look into the outputs of the inverter circuits 114 and 115. In the standby state, the cross couple nodes N3, N4 are pre-charged to the VDDH and become "0". However, when the voltage difference between the voltages N1, N2 transmitted to the cross couple nodes N3, N4 are compared and amplified, the cross couple node N3 becomes "0" and the cross couple node N4 becomes "1". Thus, the output /DO becomes "1" and the output DO becomes "0". Accordingly, the output READ of the NOR circuit 116 to which these outputs /DO and DO are inputted changes from "1" to "0" and the NMOS transistors 103, 104 become OFF. Therefore, the voltages N1, N2 at the intermediate voltage level becomes VDDH via the electric fuse 101 and the reference resistance 102.

As described above, the READ is "1" from the supply of power till starting the reading out action, and the NMOS transistors 103, 104 are in ON state. The intermediate-level voltages N1, N2 are generated at the end parts of the electric fuse 101 and the reference resistance 102 in accordance with the resistance values thereof. However, when the reading out action is started and the comparing/amplifying action of the voltage difference between the voltages N1, N2 is completed, the result is fed back. Thus, the NMOS transistors 103, 104 become OFF and the voltages N1, N2 both become VDDH.

In the process of the reading out action, in the comparing/amplifying circuit, the gate voltages of the NMOS transistors 109, 110 both become VDDH. However, data is already latched by being compared and amplified so that the data is kept stored.

As described above, in the conventional structure, the voltage levels N1 and N2, which are generated in accordance with the resistance value of the electric fuse 101 and that of the reference resistance 102, are inputted to the gates of the NMOS transistors 109, 110. Thus, in the case where, for example, elements which are formed through a manufacturing process with a large dispersion in Vt (threshold voltage) are mounted as the MOS transistors 109, 110, or external noise is applied at the time of reading out action, the following inconveniences are generated. That is, during the process of comparing and amplifying the small difference between the voltages, which is caused when the cross couple nodes N3, N4 are discharged from VDDH, there may cause mis-latching of data thus generating reading out failure.

Further, from the supply of the power until starting the reading out action, the READ is "1", the NMOS transistors 103, 104 are constantly ON, and the electric current is kept flown in the electric fuse 101 and the reference resistance 102. Therefore, in such a system LSI which uses a plurality of semiconductor memories with a memory redundant function, consumption of electric current is increased.

Further, in the comparing/amplifying circuit, the data, when determined once by the reading out action, is constantly held in the cross couple circuit (the PMOS transistors 105, 106 and the NMOS transistors 107, 108) by keeping the NMOS transistor 111 ON. Therefore, "0" is always applied to the gate of either the PMOS transistor 105 or 106 so that there may be a risk of deteriorating the PMOS transistor.

SUMMARY OF THE INVENTION

Main objects of the present invention therefore are to achieve improvements in the resistance for factors which deteriorates the properties, e.g., Vt dispersions of the MOS transistors to be mounted and the disturbance noises, and to achieve improvements in the reliability.

In order to overcome the aforementioned problem, the semiconductor memory of the present invention comprises a voltage converting circuit which voltage-converts and outputs a resistance difference between a first and a second resistance elements;

a voltage comparing circuit which outputs a comparison result in accordance with the resistance difference from an output of the voltage converting circuit;

a latch circuit for holding the comparison result of the voltage comparing circuit; and a switch circuit which cuts or connects an output side of the voltage converting circuit and an input side of the voltage comparing circuit.

Preferably, the first resistance element is constituted of an electric fuse whose resistance value changes before and after the blowout and, more preferably, it is constituted of a reference resistance. Further, preferably, the voltage comparing circuit is constituted of a differential amplifying circuit.

With the present invention, for example, it is possible to amplify the voltage by the voltage comparing circuit while keeping the voltage difference in accordance with the resistance difference. Thereby, it enables to perform a stable reading-out action which is highly resistant to dispersions in Vt (threshold voltage) of the MOS transistors of the voltage comparing circuit and to the noise at the time of reading out.

Furthermore, by controlling the semiconductor memory used for reading-out through a control signal which is formed with a one-shot pulse according to a reading-out-action command signal, consumption of electric current at the time of reading out can be reduced. In addition, it is possible to relieve stresses upon the electric fuse. With this, the reliability is further improved.

Moreover, by controlling the latch circuit and the voltage comparing circuit through a control signal formed with a pulse, it becomes possible to pre-charge the gates of the PMOS transistors which constitute the cross couple in the voltage comparing circuit, after data is latched by the latch circuit. Therefore, it enables to suppress the deterioration in the property of the PMOS transistor, which is caused due to a high bias applied between the gate and the substrate.

Furthermore, it becomes possible to start the voltage comparing circuit while keeping the voltage difference in accordance with the resistance difference. Therefore, it enables to dramatically improve the resistance to the dispersions in Vt of the MOS transistors which constitutes the voltage comparing circuit and to the noise at the time of reading out.

As described above, with the present invention, it is possible to perform a stable reading-out action, which is highly resistant to the dispersions in Vt of the MOS transistors and to the noise at the time of reading out.

Particularly, the semiconductor memory according to the present invention is effectively used as a technique for substituting a fuse element in a system LSI which comprises function blocks having a redundancy function and analog trimming function. Further, it can be applied to be in use for a chip ID, and for mounting secure information, etc.

BRIEF DESCRIPTION OF THE DRAWINGS

Other objects of the present invention will become clear from the following description of the preferred embodiments and the appended claims. Those skilled in the art will appreciate that there are many other advantages of the present invention possible by embodying the present invention.

DETAILED DESCRIPTION OF THE INVENTION

In the followings, a semiconductor memory according to embodiments of the resent invention will be described in detail by referring to the accompanying drawings.

(First Embodiment)

Figure 1:
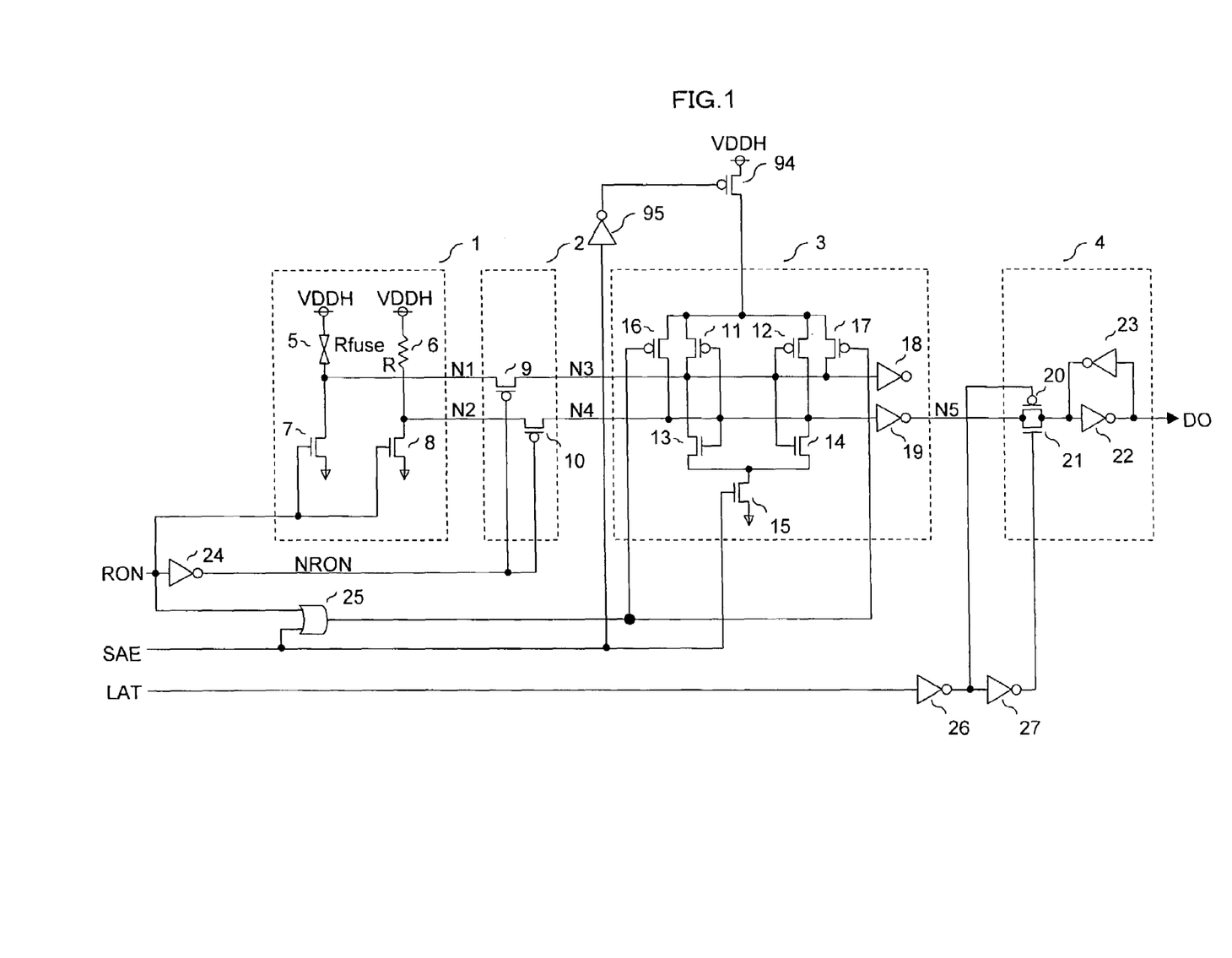
FIG. 1 is a reading-out circuit diagram of a semiconductor memory according to a first embodiment of the present invention.

FIG. 1 shows an example of a semiconductor memory which comprises an electric fuse. In FIG. 1, reference numeral 1 is a voltage converting circuit. 2 is a switch circuit. 3 is a voltage comparing circuit. 4 is a latch circuit. RON is a control signal formed with a one-shot pulse, which controls the voltage converting circuit 1, the switch circuit 2, and the voltage comparing circuit 3. SAE is a control signal formed with a one-shot pulse, which controls the voltage comparing circuit 3. LAT is a control signal formed with a one-shot pulse, which controls the latch circuit 4.

The voltage converting circuit 1 comprises an electric fuse (a first resistance element) 5, a reference resistance (a second resistance element) 6, and NMOS transistors (NMOS switches) 7, 8. One end each of both the electric fuse 5 and the reference resistance 6 is connected to a power source VDD and the other end thereof is connected to GND (ground potential) through the NMOS transistors 7, 8. The control signal RON is inputted to the gates of the NMOS transistors 7, 8.

The voltage comparing circuit 3 comprises PMOS transistors 11, 12, 16, 17, NMOS transistors 13, 14, 15, and inverter circuits 18, 19. The PMOS transistors 11, 12 and the NMOS transistors 13, 14 constitute a cross couple circuit. Sources of the PMOS transistors 11 and 12 are connected to the power source VDDH. Sources of the NMOS transistors 13 and 14 are connected to a drain of the NMOS transistor 15. A source of the NMOS transistor 15 is connected to the GND.

The control signal SAE is inputted to the gate of the NMOS transistor 15. The cross couple nodes N3 and N4 of the cross couple circuit are inputted to the inverter circuits 18 and 19, respectively. The cross couple node N3 is constituted of a common gate connection part of the PMOS transistor 12 and the NMOS transistor 14. The cross couple node N4 is constituted of a common gate connection part of the PMOS transistor 11 and the NMOS transistor 13. The output of the inverter circuit 18 is not connected to anywhere and is in a floating state. By disposing the inverter circuit 18 in the manner described above, it enables to avoid unbalanced capacities of the cross couple nodes N3 and N4.

The latch circuit 4 comprises a PMOS transistor 20, an NMOS transistor 21, and inverter circuits 22, 23. The PMOS transistor 20 and the NMOS transistor 21 constitute a switch circuit. The action of the switch circuit is controlled by a control signal LAT. An output N5 of the inverter circuit 19 is inputted to the switch circuit. The driving capacity of the inverter circuit 23 is lower than that of the inverter circuit 22, and the output of the inverter circuit 22 is inputted to the gate of the inverter circuit 23.

The circuit switch 2 comprises PMOS transistors 9 and 10. The control signal RON is inverted by an inverter circuit 24, and the inverted control signal RON is inputted to the gates of the PMOS transistors 9, 10. The output of the switch circuit 2 is connected to the cross couple nodes N3 and N4 of the voltage comparing circuit 3.

Reference numerals 26, 27 and 95 are inverter circuits, 26 is an OR circuit having two input terminals and 95 is PMOS transistor. The control signal RON and the control signal SAE are inputted to the OR circuit 26, and the output is connected to the gates of the PMOS transistors 16, 17. Further, the control signal LAT is inputted to the inverter circuit 26, and the output of the inverter circuit 26 is connected to the PMOS transistor 20 and the inverter circuit 27. The output of the inverter circuit 27 is connected to the NMOS transistor 21. In the voltage comparing circuit 3, the PMOS transistor 94 is disposed between the power source VDDH and the sources of the PMOS transistors 11, 12. An inversion signal of the control signal SAE is inputted to the gate of the PMOS transistor 94 via the inverter circuit 95.

The inverter circuits 18, 19, 22, 23, 26, and 27 have the VDD as a power supply voltage. The inverter circuit 24 and the OR circuit 25 have the VDDH as a power supply voltage. The relationship between the VDDH and the VDD is expressed as VDDH>VDD.

Figure 2:
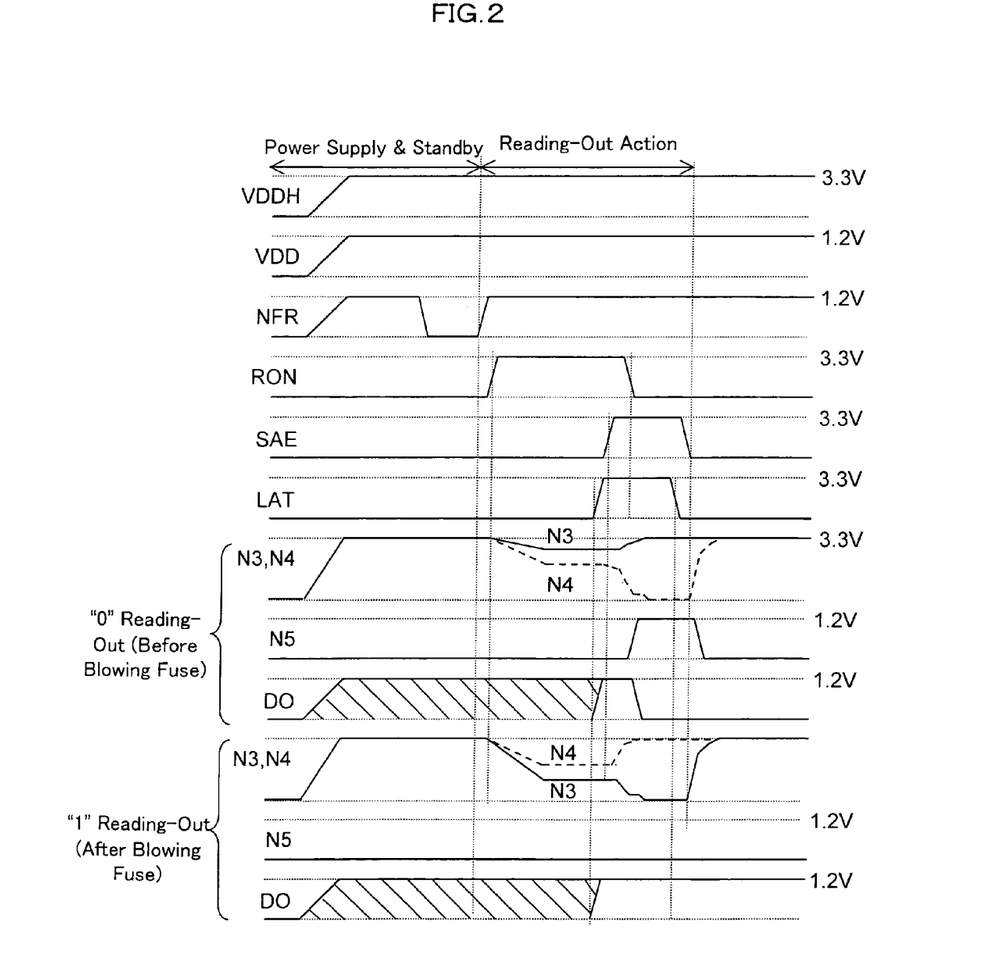
FIG. 2 is a timing chart of a reading out action according to the first embodiment.

The action of the semiconductor memory formed as described above will be described by referring to FIG. 2. In FIG. 2, the VDDH is a 3.3 V type power supply voltage and the VDD is a 1.2 V type power supply voltage. NFR is a reading-out-action command signal of 1.2 V type, which is inputted from outside. RON is a control signal (a first control signal) for, respectively, the voltage converting circuit 1, the switch circuit 2, and the voltage comparing circuit 3. SAE is a control signal (a third control signal) for the voltage comparing circuit 3. Lat is a control signal (a fourth signal) for the latch circuit 4. NRON, although not shown in FIG. 2, is a second control signal which is inputted to the switch circuit 2. These control signals are generated in accordance with the external signal NFR and have such a signal form that is formed with a one-shot pulse. The second control signal is included in the first control signal.

(Standby Period—Period from Supply of Power until Starting Reading-Out Action)

In this period, the reading-out-action command NFR is "1" or "0", and the control signals RON, SAE, and LAT are "0". In the voltage converting circuit 1 under that state, the NMOS transistors (MOS switches) 7 and 8 are OFF, so that there is no electric current flown in each of the input/output terminals of the electric fuse 5 (the first resistance element) and the reference resistance 6 (the second resistance element). The electric fuse 5 bears a change in the resistance value corresponding to reading out of data. The reference resistance 6 has a reference resistance value which is used for detecting the change in the resistance value of the electric fuse 5.

Since there is no supply of the electric current to the electric fuse 5 and the reference resistance 6, the voltage converting circuit 1 cannot perform a voltage converting action for corresponding to the difference between the resistance value of the electric fuse 5 and that of the reference resistance 6. Thus, the output voltages N1 and N2 are both in the VDDH level. Therefore, whether the electric fuse is blown or not, the resistance difference between the electric fuse 5 and the reference resistance 6 is not voltage-converted in the voltage converting circuit 1.

The voltage comparing circuit 3 in this state operates as follows. That is, the NMOS transistor (MOS switch) 15 is OFF, the output of the OR circuit 25 is "0", and the cross couple nodes N3, N4 are pre-charged to the VDDH by the PMOS transistors 16, 17. Thus, the output N5 of the inverter circuit 19, which is the output of the voltage comparing circuit 3, becomes "0".

The latch circuit 4 in this state operates as follows. That is, the control signal LAT is "0", the output of the inverter circuit 26 is "1", and the output of the inverter circuit 27 is "0". Therefore, the PMOS transistor 20 and the NMOS transistor 21 are both in OFF state. Thereby, the output DO of the latch circuit becomes "0" or "1".

The switch circuit 2 in this state operates as follows. That is, the PMOS transistors 9 and 10 are OFF (in a cut state) even though the PMOS transistors 9, 10 function as the MOS switches for connecting or cutting the outputs N1, N2 of the voltage converting circuit 1 and the cross couple nodes N3, N4 of the voltage comparing circuit 3. Thus, the output N1 and the cross couple node N3 are in a cut state, and the output N2 and the cross couple node N4 are in a cut state as well. Therefore, the output of the voltage converting circuit 1 is not inputted to the voltage comparing circuit 3.

("0" Reading-Out Action—Electric Fuse 5 is not Blown)

When the reading-out-action command signal NFR changes from "0" to "1" after a supply of the electric power, the control signal RON formed with a one-shot pulse is produced according to a leading edge which is generated by the above-described change in the signal level from "0" to "1".

The voltage converting circuit 1 in this state operates as follows. That is, the NMOS transistors (MOS switches) 7 and 8 become ON thus flowing the electric current to each of the electric fuse 5 and the reference resistance 6. With this, there is a voltage drop caused in accordance with the difference between resistance value Refuse of the electric fuse 5 and resistance value R of the reference resistance 6. Due to the voltage drop, the output voltages N1 and N2 come to have a voltage level lower than the VDDH. As described above, the voltage converting circuit 1 performs voltage conversion in accordance with the difference between the resistance value of the electric fuse 5 and that of the reference resistance 6.

In a state where "0" is read out as the data, the electric fuse 5 maintains the initial resistance state (unblown state). The resistance value of the unblown electric fuse 5 is low. Thus, the resistance value R of the reference resistance 6 becomes larger than the resistance value Refuse of the electric fuse 5 (Refuse<R). Therefore, in the above-described voltage conversion, the relationship between potential (voltage) of the output N1 and potential (voltage) of the output N2 are expressed as the output N1 potential (voltage)>the output N2 potential (voltage).

The voltage comparing circuit 3 in this state operates as follows. That is, when the control signal RON becomes "1", the output of the OR circuit 25 becomes "1". Thus, the PMOS transistors 16 and 17 of the voltage comparing circuit 3 become OFF. Therefore, the pre-charge of the cross couple nodes N3 and N4 is released and, at the same time, the states of the PMOS transistors 9 and 10 of the switch circuit 2 change over to ON state. Thereby, the outputs N3, N4 of the voltage converting circuit 1 and the cross couple nodes (the inputs of the voltage comparing circuit 3) N3, N4 are connected. As a result, the voltage level of the cross couple nodes N3 and N4 becomes the voltage level of the outputs N11 and N2 of the voltage converting circuit 1.

After the control signal RON becomes "1" and then the control signal SAE becomes "1", the NMOS transistor 15 of the voltage comparing circuit 3 becomes ON, and the voltage comparing circuit 3 starts an action for comparing the difference between the voltages of both the cross couple nodes N3 and N4. By the amplifying effect of the comparing action, the relationship between the potential (voltage) of the output N1 and the potential (voltage) of the output N2 becomes N1>N2. Thereby, the potential of the cross couple node N3 becomes the VDDH level and the potential of the cross couple node N4 becomes the GND level. Thus, the output N5 of the inverter circuit 19, which inverts the voltage of the cross couple node N4 upon receiving the input thereof, becomes "1".

In the latch circuit 4, the output DO of the latch circuit 4 before the reading-out action is either "0" or "1". However, when the control signal LAT becomes "1", both the PMOS transistor 20 and the NMOS transistor 21 of the latch circuit 4 come under ON state to be in action. With this, the data based on the output N5 (the output of the inverter circuit 19) of the voltage comparing circuit 3 is outputted to the output DO of the latch circuit 4. In the case of "0" reading-out, when the control signal LAT becomes "1", the output DO of the latch circuit 4 once becomes "1" by detecting that the output N5 of the voltage comparing circuit 3 is "0", while the cross couple node N4 of the voltage comparing circuit 3 is compared/amplified and discharged to "0" from the intermediate potential. When, during that process, the voltage of the cross couple node N4 changes over to the switching voltage level of the inverter circuit 19 of the voltage comparing circuit 3 or less, the output N5 of the voltage comparing circuit 3 changes form "0" to "1". Upon this change, the output DO of the latch circuit 4 changes from "1" to "0". Subsequently, when the control signal LAT changes from "1" to "0", both the PMOS transistor 20 and the NMOS transistor of the latch circuit 4 change over to OFF state. Thus, the "1" data of the output N5 of the voltage comparing circuit 3 is latched by the latch circuit 4. Thereby, the output DO of the latch circuit 4 maintains the "0" reading-out state. When the control signal SAE becomes "0", the output of the OR circuit 25 becomes "0". Thus, the cross couple nodes N3, N4 of the voltage comparing circuit 3 are pre-charged to the VDDH by the PMOS transistors 16, 17 of the voltage comparing circuit 3, and the output N5 of the voltage comparing circuit 3 changes from "1" to "0".

("1" Reading-out Action—After Electric Fuse is Blown)

When the reading-out-action command signal NFR changes from "0" to "1" after a supply of the electric power, the control signal RON formed with a one-shot pulse is produced according to a leading edge of the change from "0" to "1".

In the voltage converting circuit 1, the NMOS transistors 7 and 8 become ON thus flowing the electric current to each of the electric fuse 5 (the first resistance element) and the reference resistance 6 (the second resistance element). With this, there is a voltage drop generated in accordance with the difference between resistance value Refuse of the electric fuse 5 and resistance value R of the reference resistance 6. Due to the voltage drop, the output voltages N1 and N2 come to have a voltage level lower than the VDDH.

In the case of "1" reading-out, that is, when the electric fuse 5 is blown, the resistance value R of the reference resistance 6 is larger than the resistance value Refuse of the electric fuse 5 (Refuse>R), so that there is a relationship that the potential (voltage) of the output N1<the potential (voltage) of the output N2.

In the voltage comparing circuit 3, when the control signal RON becomes "1", the output of the OR circuit 25 becomes "1". Thus, the PMOS transistors 16 and 17 of the voltage comparing circuit 3 become OFF. Therefore, the pre-charge of the cross couple nodes N3 and N4 of the voltage comparing circuit 3 is released and the states of the PMOS transistors 9 and 10 of the switch circuit 2 change over to ON state. As a result, the voltage level of the cross couple nodes N3 and N4 becomes the voltage level of the outputs N1 and N2 of the voltage converting circuit 1.

After the control signal RON becomes "1" and then the control signal SAE becomes "1", the NMOS transistor 15 of the voltage comparing circuit 3 becomes ON, and the voltage comparing circuit 3 starts an action for comparing/amplifying the difference between the voltages of both the cross couple nodes N3 and N4. By the amplifying effect, the output level of the cross couple node N3 becomes the GND level and the output level of the cross couple node N4 becomes the VDDH level. However, the output level of the cross couple node N4 is not changed down to reach the switching voltage of the inverter circuit 19 of the voltage comparing circuit 3 or lower. Thus, the output N5 of the voltage comparing circuit 3 is maintained as "0".

In the latch circuit 4, the output DO of the latch circuit 4 before the reading-out action is either "0" or "1". However, when the control signal LAT becomes "1", both the PMOS transistor 20 and the NMOS transistor 21 of the latch circuit 4 come under ON state. With this, the data based on the output N5 of the voltage comparing circuit 3 is outputted to the output DO of the latch circuit 4. In the case of "1" reading-out, when the control signal LAT becomes "1", the output DO of the latch circuit 4 becomes "1" in accordance with the output state ("0" state) of the output N5 of the voltage comparing circuit 3, and the cross couple node N4 of the voltage comparing circuit 3 is compared/amplified and charged to "1" from the intermediate potential. When, during that process, the potentials of the cross couple nodes N3, N4 change over to the switching voltage level of the inverter circuit 19 of the voltage comparing circuit 3 or less, the output N5 of the voltage comparing circuit 3 changes form "0" to "1". Upon this change, the output DO of the latch circuit 4 changes from "1" to "0". However, the output N5 of the voltage comparing circuit 3 maintains the "0" state so that the output DO of the latch circuit 4 maintains the "1" state as well.

Then, when the output level of the control signal LAT changes from "1" to "0", the PMOS transistor 20 and the NMOS transistor 21 of the latch circuit 4 come under OFF state. Therefore, the "0" data of the output N5 of the voltage comparing circuit 3 is latched and the output DO of the latch circuit 4 maintains "1". Here, when the control signal SAE becomes "0", the output of the OR circuit 25 becomes "0". Thereby, the cross couple nodes N3 and N4 of the voltage comparing circuit 3 are pre-charged to the VDDH by the PMOS transistors 16 and 17 of the voltage comparing circuit 3. Therefore, the output N of the voltage comparing circuit 3 maintains "0".

As described above, it becomes possible to start the voltage comparing circuit 3 while maintaining the above-described voltage difference by having a structure wherein: the switch circuit 2 is provided between the voltage converting circuit 1 and the voltage comparing circuit 3; and the voltage difference between the outputs N1 and N2, which is generated in accordance with the difference between the resistance value Refuse of the electric fuse 5 and the resistance value R of the reference resistance 6 in the voltage converting circuit 1, is connected to the cross couple nodes N3 and N4 of the voltage comparing circuit 3. With this, it enables to remarkably improve the resistance to dispersions in Vt (threshold value) of the MOS transistors and the resistance to noise at the time of reading-out action.

Further, as shown in FIG. 2, it enables to perform more stable reading-out action by having a structure wherein:

an overlap period is provided for the control signal RON which drives the switch circuit 2 to be ON and the control signal SAE which drives the voltage comparing circuit 3 to be ON; and there is no period provided, in which the cross couple nodes N3 and N4 of the voltage comparing circuit 3 become high-Z state.

By performing the pulse control for the reading-out action based on the reading-out-action command signal NFR which is outputted from outside, the electric current used for reading out can be reduced. Also, by relieving the stress on the electric fuse 5, it enables to improve the reliability.

Furthermore, by providing the latch circuit 4, it becomes possible to pulse-control the voltage comparing circuit 3. After latching the data, deterioration in the property of the MOS transistor can be suppressed by pre-charging the gates of the PMOS transistors 11, 12 of the voltage comparing circuit 3 to the VDDH which is the same as the substrate potential. The deterioration of the property herein means the property deterioration which is caused due to the high voltage applied between the gate and the substrate.

(Modification Example of the First Embodiment)

In the voltage converting circuit 1, the voltage difference between both outputs N1, N2 of the voltage converting circuit 1 is controlled by the driving capacity of the NMOS transistors 7, 8 of the voltage converting circuit 1. However, the device size of the NMOS transistors 7, 8 needs to be designed such that it enables to maintain the voltage margin for the dispersions of Vt (threshold voltage) of the MOS transistors in the voltage comparing circuit 3 and the voltage margin for the noise, etc. even under the worst condition for the reading-out action.

During a normal operation, the voltage of as high as about 3.6 V is applied to the NMOS transistors 7 and 8 of the voltage converting circuit 1. However, in a reliability test, still higher voltage (as high as about 4.1 V) is applied. That is, at the time of conducting the reliability test, there is a greater electric current than the normal operation to be flown in the electric fuse 5. Thus, when the greater electric current flows in the electric fuse 5, there is a concern that the resistance value is changed by the blowout of the silicide and cause reading-out failure when used for the normal operation.

Figure 3:
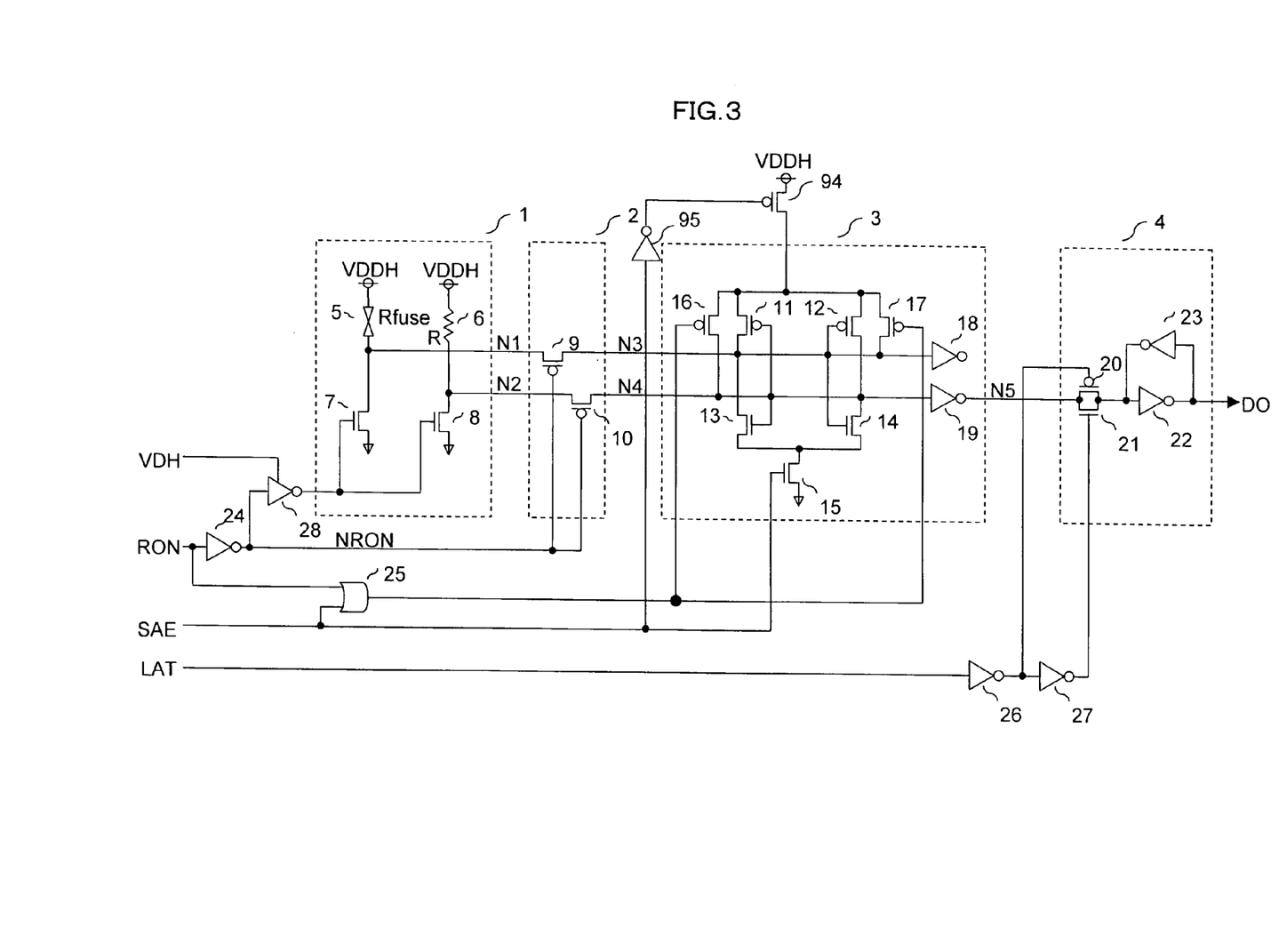
FIG. 3 is a reading-out circuit diagram of a semiconductor memory according to a modification example of the first embodiment.
Figure 4:
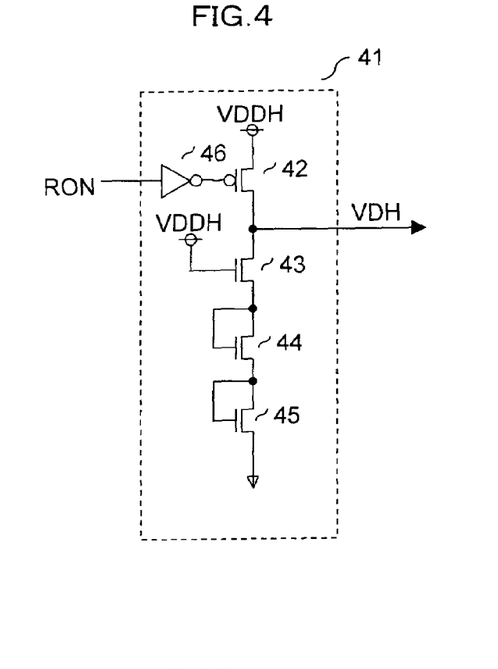
FIG. 4 is a diagram of a voltage level control circuit according to the modification example of the first embodiment.

FIG. 3 shows the modification example of the first embodiment, which overcomes this problem. In FIG. 4, VDH indicates an internally-generated power supply voltage having a lower voltage than the VDDH. Reference numeral 28 is an inverter circuit whose drain is connected to the VDH. The output of the inverter circuit 28 is inputted to the NMOS transistors 7, 8 of the voltage converting circuit 1, and the output of the inverter circuit 24 is inputted o the inverter circuit 28. The components with the same reference numerals as those of FIG. 1 have the same functions and roles, so that the description thereof will be omitted.

Figure 5:
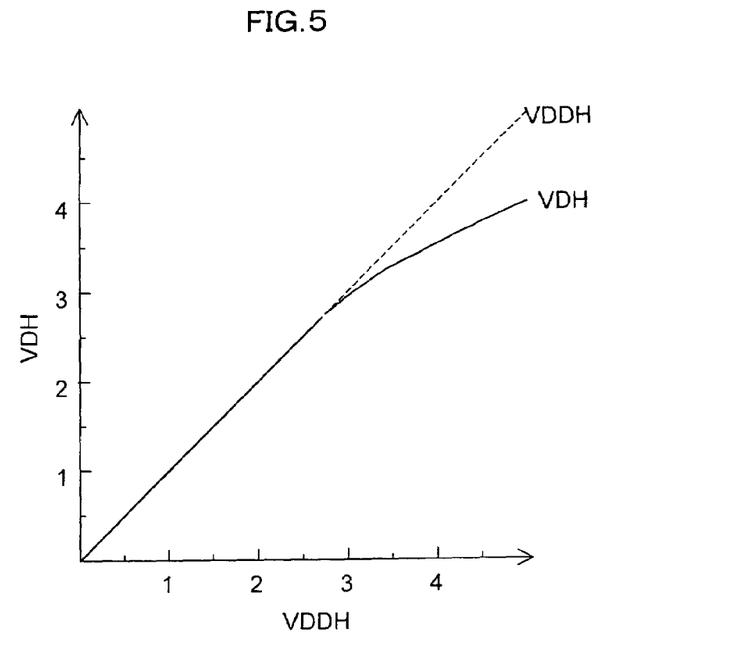
FIG. 5 is a voltage DC property of the voltage level control circuit according to the modification example of the first embodiment.

FIG. 4 is an example of a circuit diagram of a VDH generator and FIG. 5 shows the voltage property thereof. In FIG. 4, reference numeral 42 is a PMOS transistor. 43, 44, and 45 are NMOS transistors. 46 is an inverter circuit. The control signal RON is inputted to the inverter circuit 46, the output of the inverter circuit 46 is connected to the PMOS transistor 42, gates of the NMOS transistors 44, 45 are connected to the respective drains, the gate of the NMOS transistor 43 is connected to the VDDH, and the drain of the PMOS transistor is outputted as VDH.

In FIG. 5, the horizontal axis is the power supply voltage VDDH and the vertical axis is the output VDH. As the voltage of the VDD increases, the VDH becomes the clamped voltage which is lower than the VDDH.

The power supply voltage VDH having such voltage property is generated in accordance with the control signal RON which is formed with a one-shot pulse. Then, the NMOS transistor 7 of the voltage converting circuit 1 is controlled by the generated power supply voltage VDH. Thereby, when conducting the reliability test, the voltage which is practically lower than the external power supply voltage VDDH is applied to the NMOS transistor 7. Thus, the electric current flown in the electric fuse 5 is modified thus improving the reliability.

As the power supply voltage to be supplied to the semiconductor memory comprising the electric fuse, it is necessary to provide two different power supply terminals; one of which is a 3.3 V type high voltage VDDH for blowing the fuse, and the other is a 1.2 V type low voltage VDD as the reading-out signal and an IF signal of the read-out data signal. In the first embodiment and the like, the VDDH is supplied to the voltage converting circuit 1 and the voltage comparing circuit 3, and the VDD is supplied to the latch circuit 4 which outputs the read-out data DO. By using the VDDH also as the high voltage power supply terminal to be supplied to the IO cells but not providing it as an exclusive power supply terminal, it enables to reduce the number of pins. In addition, by using the VDD as a low voltage power supply terminal to be supplied to the IO cells or as the power supply terminal of a logic circuit but not providing it as an exclusive terminal, the number of the pins can be further reduced. By achieving the reduction of the number of the pins in the manner as described above, it becomes easy to mount this semiconductor memory to a system LSI.

When the voltage of the IF signal of the read-out data signal is the VDD, it is necessary to reduce the voltage level of the data output signal from the VDDH to the VDD during the process from the reading-out action to the output of the data. In the first embodiment (FIG. 1), it is necessary to supply the high voltage VDDH to the voltage converting circuit 1 and the voltage comparing circuit 3. However, the circuit structures which are positioned after the inverter circuits 18, 19 in terms of the signal processing can be driven by the VDD power source. For example, when the power supply of the inverter circuits 18, 19 is the VDD, the latch circuit 4 positioned after the inverter circuits 18, 19 can be designed as a device whose power supply source is the VDD. As described above, by designing the circuit as the device whose power supply source is the VDD, the MOS transistor having the VDD as the gate input can be constituted of a device with a thin gate oxide film. Therefore, it enables to reduce the area of the device compared to the case where it is constituted of a device with a thick gate oxide film.

(Second Embodiment)

In the case where the latch gate of the first embodiment (FIG. 1) is constituted of a MOS transistor with a thin gate oxide film, the voltage level of the control signal becomes as follows. That is, the control signals RON, SAE have the voltage level which is boosted from the VDD to the VDDH according to the external input signal NFR (VDD level), whereas the control signal LAT becomes the voltage level of the VDD. However, under such voltage properties, if the voltage converting circuit 1 and the voltage comparing circuit 3 are controlled by the control signal RON, SAE of the VDDH level and the latch circuit 4 is controlled by the control signal LAT of the VDD level, there may cause a following inconvenience. Specifically, when the VDD is the low voltage and the VDDH is the high voltage, there may be a timing skew generated between the control signals RON, SAE of the VDDH level and the control signal LAT of the VDD level. Such timing skew will be described by referring to a timing chart of FIG. 6.

Figure 6:
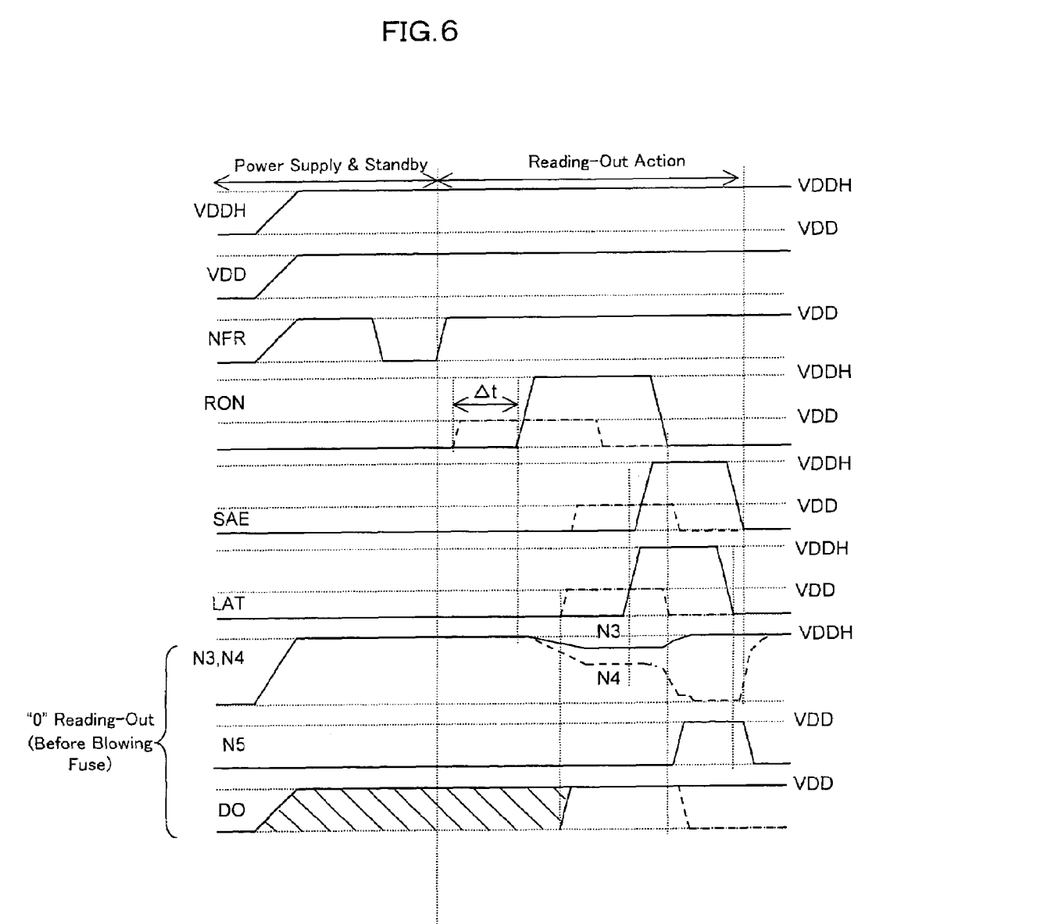
FIG. 6 is a timing chart of a reading out action according to a second embodiment of the present invention.

When the external input signal NFR changes from "0" to "1" after a supply of the power, first, the control signal RON of the VDD level shown by a broken line generates. Then, with a delay of time Δt, the control signal RON of the VDDH level shown by a solid line generates. Similarly, for the control signal SAE, after generation of the control signal of the VDD level shown by a broken line, the control signal SAE of the VDDH level shown by a solid line generates with the delay of time Δt. For these two signals, although the VDD-level signal delays with respect to the VDDH-level signal, the relative action timings are consistent. Thus, there is no specific problem to be raised in terms of the operation. However, if only the latch circuit 4 is controlled by the control signal LAT of the VDD level which is shown by a broken line, the control signal RON becomes "1". Then, first, there generates a voltage difference between the electric fuse 5 and the reference resistance 6. Accordingly, the control signal SAE becomes "1" so that the voltages of the cross couple nodes N3 and N4 of the voltage comparing circuit 3 are amplified. Therefore, the potential of the cross couple node N4 becomes "0" and the potential of the output N5 changes from "0" to "1", respectively. In accordance with this, the potential of the output DO of the latch circuit 4 changes from "1" to "0". Thus, before determining the reading out data, the control signal LAT changes from "1" to "0" so that the latch circuit 4 becomes OFF. As a result, the right data "0" cannot be latched so that there may cause a reading-out failure.

Therefore, as shown in FIG. 6, after boosting the level of the control signal LAT once from the VDD level shown by a broken line to the signal of the VDDH level shown by a solid line, the signal level is again brought down to the VDD level to be inputted to the latch circuit 4. With this, the timing skew between the control signal LAT and the control signals RON, SAE can be adjusted. By controlling the voltage levels of the control signals in this manner, mismatch of the timing with respect to each control signal can be overcome. Therefore, it enables to achieve a stable reading-out action even in the voltage area (in the voltage area where the VDD is the low voltage and the VDDH is the high voltage) where, conventionally, the reading-out action is likely to become unstable.

(Third Embodiment)

There may be manufacture dispersions and blown-resistance dispersions generated in the initial resistance of the electric fuse 5 or the resistance value thereof after the blowout even if the electric fuse 5 is formed by using any selected types of materials. For example, in the semiconductor memory comprising the electric fuse 5, if the resistance value of the electric fuse 5 is the value with a smaller margin with respect to the reference resistance 6, the resistance value fluctuates when the electric fuse 5 is energized while being used as a product. Thus, a reading-out failure may be caused. Such failures happen even if, during the inspection, the "0" reading-out action and "1" reading-out action are normally carried out for the value of the reference resistance 6.

In order to avoid such failures in advance, the semiconductor memory of this embodiment comprises a circuit structure which checks the resistance value margins before and after the blowout of the electric fuse during the inspection. With this, it is possible to find the device with a small margin by performing screening in advance, so that generation of malfunctions can be avoided beforehand.

Figure 7:
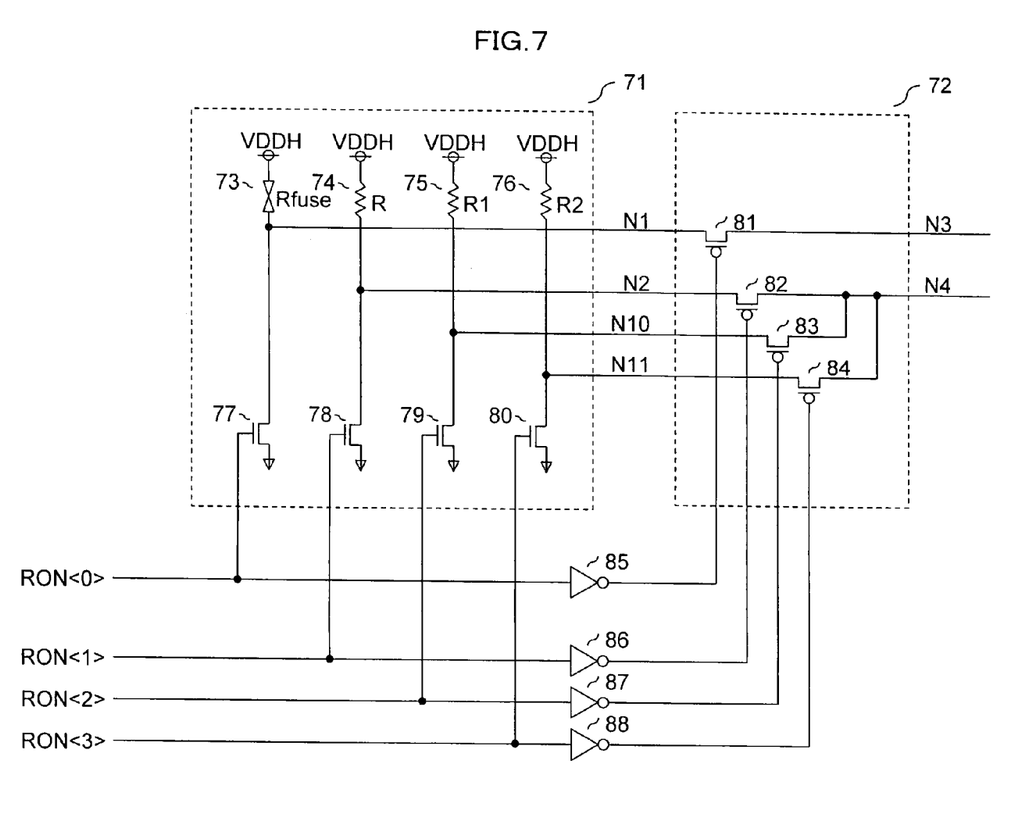
FIG. 7 is a reading-out circuit diagram of a semiconductor memory according to a third embodiment of the present invention.

FIG. 7 shows an example of a semiconductor memory which comprises a structure for checking the resistance value margins after the blowout of the electric fuse. In FIG. 7, reference numeral 71 is a voltage converting circuit, and 72 is a switch circuit.

The voltage converting circuit 71 comprises an electric fuse (a first resistance element) 73, reference resistances (second, third, and fourth resistance elements) 74, 75, 76, and NMOS transistors 77, 78, 79, 80 as the MOS switches. The switch circuit 72 comprises PMOS transistors 81, 82, 83, and 84. 85, 86, 87, and 88 are inverter circuits.

The resistance values of the reference resistances 74, 75, and 76 are R, R1, and R2, respectively, and the relationship thereof can be expressed as R1<R<R2. One end of the electric fuse 73 and one end each of the reference resistances 74, 75, 76 are connected to the power source VDDH, and the other ends thereof are connected to the MOS transistors 77, 78, 79, 80, respectively. Different control signals RON <3:0> (RON <0>, RON <1>, RON <2>, RON <3>) are connected to the gates of the NMOS transistors 77, 78, 79, 80, and each of intermediate nodes N1, N2, N10, N11 are connected to one end of respective PMOS transistors 77, 78, 79, 80. Outputs of inverter circuits 85, 86, 87, and 88 are connected to the gates of the PMOS transistors 81, 82, 83 and 84. The RON <0>, RON <1>, RON <2>, and RON <3> are connected to the inverter circuits 85, 86, 87, and 88. The node N1 is connected to the cross couple node N3 via the PMOS transistor 81. The nodes N2, N10, and N11 are connected to the cross couple node N4 via the PMOS transistors 82, 83, and 84. The circuit structure after the cross couple nodes N3, N4 in terms of a signal processing direction is the same as the one shown in FIG. 1, so that the description will be omitted.

In the reading-out circuit formed as described above, at the time of a normal reading-out action, by making the RON <0> and the RON <1> ON, the NMOS transistors 77 and 78 become ON. Thereby, the voltages are generated to the outputs N1 and N2 in accordance with the resistance values thereof. At the same time, by making the PMOS transistors 81, 82 ON, the outputs N1 and N2 are transmitted to the cross couple nodes N3 and N4 of the voltage comparing circuit 3 which is not shown in the drawing. At this time, the RON <2> and the RON <3> are "0", and the NMOS transistors 79, 80 and the PMOS transistors 83, 84 are OFF.

For checking the initial resistance (unblown state) margin of the electric fuse 73, voltages are generated to each of the outputs N1 and N10 in accordance with the respective resistance value by respectively making ON the RON <0> which flows the electric current to the electric fuse 73 and the RON <2> which flows the electric current to the reference resistance 75 having the resistance lower than the reference resistance used for a normal reading-out action. With this, the voltage of the output N1 is transmitted to the cross couple node N3, and the voltage of the output N10 is transmitted to the cross couple node N4. Also, comparing/amplifying processing of the voltage is performed on each of the outputs N1 and N10, and the voltage of the output DO of the latch circuit 4 is monitored.

When there is a resistance margin in the electric fuse 73, the reading-out value of the voltage of the output DO of the latch circuit becomes "0". On the other hand, when there is no resistance margin, the reading-out value of the voltage of the output DO of the latch circuit 4 becomes "1". With this, the initial resistance margin of the electric fuse 73 can be checked.

In the meantime, for checking the resistance margin after blowing the electric fuse 73, the RON <3> is made ON for flowing the electric current to the RON <0> which flows the electric current to the electric fuse 73, and for flowing the electric current to the reference resistance 76 having the resistance higher than the reference resistance which is used for a normal reading-out action. With this, the voltages are generated in both the outputs N1, N11 in accordance with the resistance values thereof. At the same time, the PMOS transistors 81, 84 are made ON for transmitting the voltage of the output N1 to the cross couple node N3 and the voltage of the N11 to the cross couple node N4. Thereby, comparing/amplifying processing is carried out between the voltage of the output N1 and the voltage of the output N11, and the voltage of the output DO of the latch circuit 4 is monitored.

When there is the resistance margin in the electric fuse 73, the voltage of the output DO of the latch circuit 4 for reading out becomes "1", whereas the voltage of the output DO of the latch circuit 4 for reading out becomes "0" when there is no resistance margin. With this, the resistance margin after the blowout of the electric fuse 73 can be checked.

(Fourth Embodiment)

Figure 8:
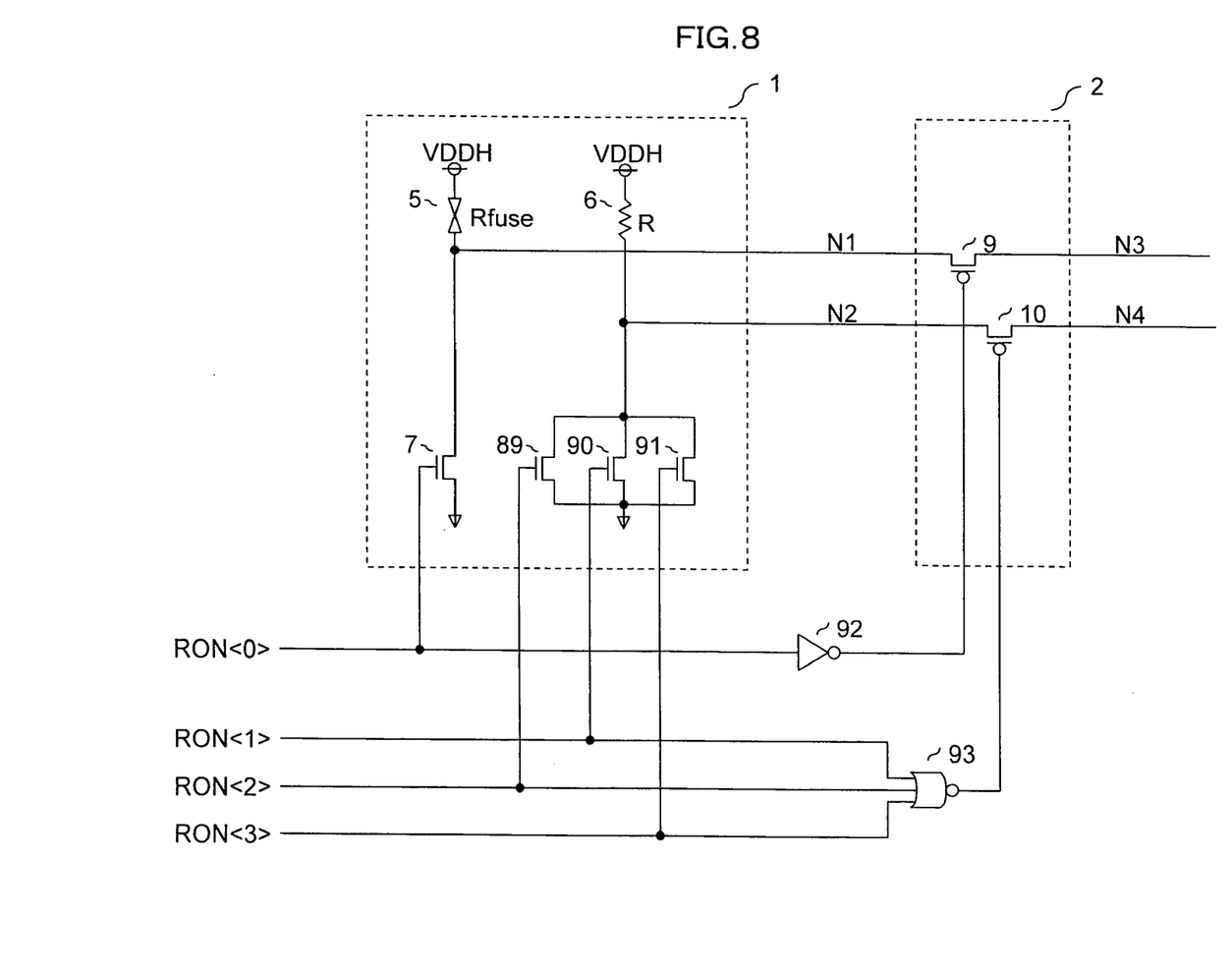
FIG. 8 is a reading-out circuit diagram of a semiconductor memory according to a fourth embodiment of the present invention.

For checking the resistance margin as described above, the effect similar to that of the circuit structure shown in FIG. 7 can be achieved by a following circuit structure having a smaller area. In this structure, as shown in FIG. 8, only a single kind of reference resistance is provided for enabling to vary the driving capacities of the NMOS transistors connected to this reference resistance, so that the voltage of the output N1 of the voltage converting circuit 1, which is generated in accordance with the resistance difference between that of the electric fuse, can be varied.

(Fifth Embodiment)

Figure 9:
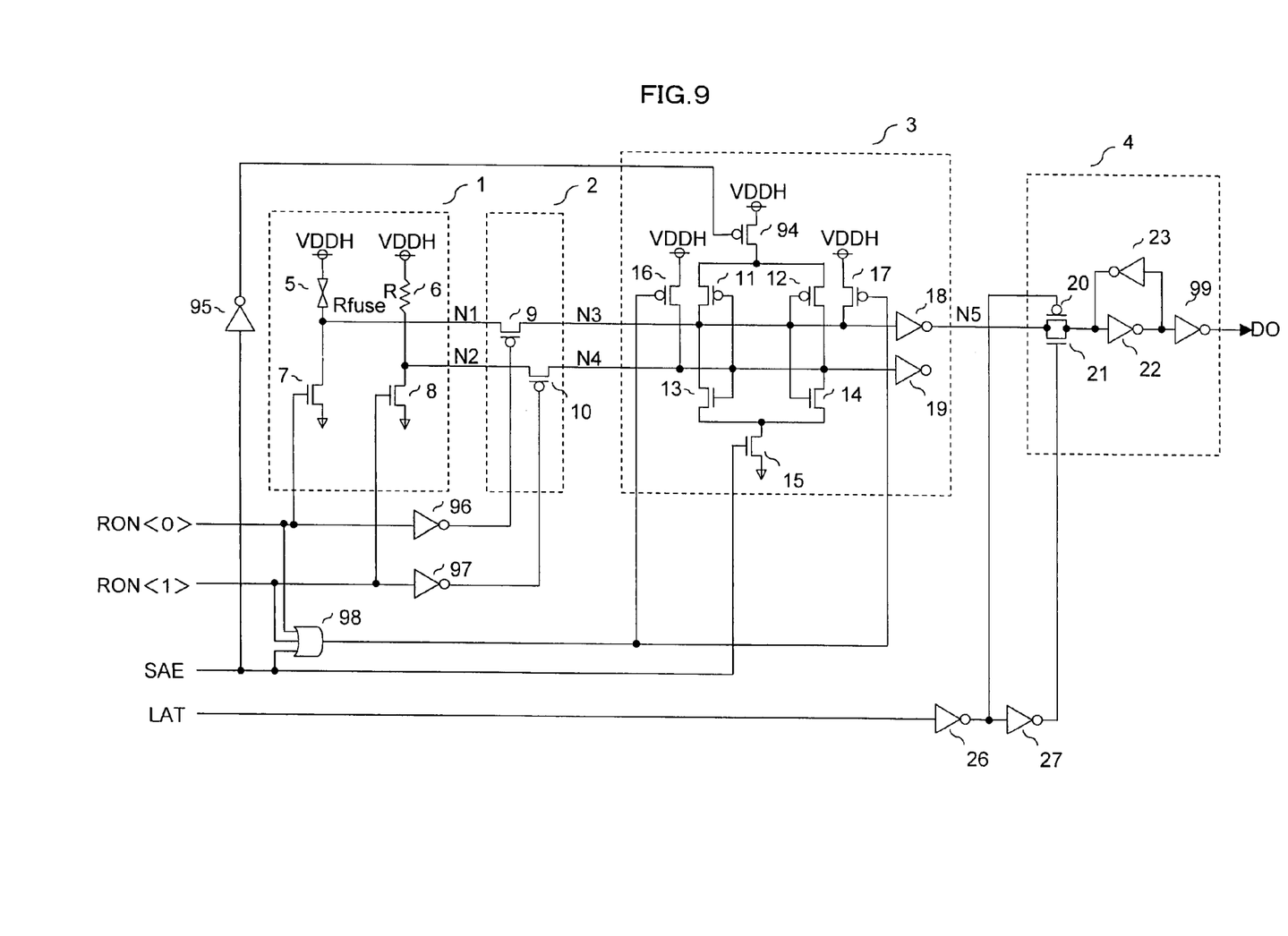
FIG. 9 is a reading-out circuit diagram of a semiconductor memory according to a fifth embodiment of the present invention.

Next, described by referring to FIG. 9 is the action of the semiconductor memory which comprises a structure for indirectly measuring the resistance value after the blowout of the electric fuse 5. In FIG. 9, reference numeral 94 is a PMOS transistor. 95, 96, 97, and 99 are inverter circuits. 98 is an OR circuit with three inputs. The control signals RON <0> and RON <1> are signals for controlling the voltage converting circuit 1, the switch circuit 2, and the voltage comparing circuit 3. The control signal RON <0> is inputted to the NMOS transistor 7 of the voltage converting circuit 1 and to the inverter circuit 96. The output of the inverter circuit 96 is inputted to the gate of the PMOS transistor 9 of the switch circuit 2. The control signal RON <1> is inputted to the NMOS transistor 8 of the voltage converting circuit 1 and to the inverter circuit 97. The output of the inverter circuit 97 is inputted to the gate of the PMOS transistor 10 of the switch circuit 2. In the voltage comparing circuit 3, the PMOS transistor 94 is disposed between the power source VDDH and the sources of the PMOS transistors 11, 12. An inversion signal of the control signal SAE is inputted to the gate of the PMOS transistor 94 via the inverter circuit 95. The control signals RON <0>, RON <1>, and SAE are inputted to the OR circuit 98. The output of the OR circuit 98 is inputted to the gates of the PMOS transistors 16, 17 of the voltage comparing circuit 3. The components with the same reference numerals as those of FIG. 1 have the same functions and roles, so that the description thereof will be omitted.

In the semiconductor memory comprising the above-described structure, when the control signal RON <0> is exclusively enabled at the time of measuring the resistance of the electric fuse 5, the NMOS transistor 7 of the voltage converting circuit 1 becomes ON. Thus, an intermediate-level potential which is lower than the VDDH is generated in the output N1 of the voltage converting circuit 1. The generated potential transmits to the cross couple node N3 of the voltage comparing circuit 3 via the PMOS transistor 9 of the switch circuit 2. At this time, the output of the OR circuit 98 is "1", so that the pre-charge of the cross couple node N3 is being released.

At the time of a normal reading-out action, the control signal SAE is enabled thus starting the comparing/amplifying processing of the voltage difference, and the control signal LAT is enabled so that the data is outputted to the output DO of the latch circuit 4. However, in a mode for measuring the resistance values, it is controlled so that only a control signal eSAE is disabled. Therefore, the voltage comparing circuit 3 does not start to operate and the output which is in a state in accordance with the voltage level of the cross couple node N3 is outputted to the output N5 of the voltage comparing circuit 3. That is, in the case where the cross couple node N3 is higher than the level of the switching voltage of the inverter circuit 18, the output N5 of the voltage comparing circuit 3 becomes "0" and, inversely, the output N5 becomes "1" when it is lower. At this time, the cross couple node N3 becomes the analog voltage level which depends on the resistance of the electric fuse 5 and the VDDH.

Thus, the voltage values of the VDD by which the sate of the output signal varies are read out through monitoring the output DO of the latch circuit 4 by performing the processing of: setting the power supply voltage of the inverter circuit 18 as VDD; fixing the output level of the VDDH; and changing the VDD as a parameter. With this, it becomes possible to indirectly measure the resistance value of the electric fuse.

The inverter circuit 99 is added to the latch circuit 4 of FIG. 9. This is provided because the output N5 of the voltage comparing circuit 3 is changed from the output of the inverter circuit 19 to the output of the inverter circuit 18, and it is for aligning the logic of the output signal with respect to the resistance value of the electric fuse 5.

The embodiments of the present invention have been described above by referring to FIG. 1–FIG. 9, however, each of the circuit structures are not intended to be limited to the structures shown in the drawings. Any structures may be employed as long as the structures achieve the same functions.

The resistance value of the electric fuse before and after the blowout varies depending on the materials used and the shapes when formed. Thus, the reference resistance value may be set in a value with a sufficient margin for the MAX value including the dispersions before the blowout and for the MIN value including the dispersions after the blowout. By using a silicide resistance of polysilicon as the electric fuse element and using non-silicide polysilicon as the reference resistance element, it is possible to achieve the reference resistance by a small size since the sheet resistance is sufficiently higher than using silicide though there is a little difference in the resistance properties for the process dispersions.

Further, when the reference. resistance is formed by connecting in series a plurality of elements with the same material and the shape as those of the electric fuse, it is possible to set the resistance with a sufficient margin for the process dispersions an the like though the area becomes slightly larger.

The present invention has been described in detail by referring to the most preferred embodiments. However, various combinations and modifications of the components are possible without departing from the sprit and the broad scope of the appended claims.

What is claimed is:

1. A semiconductor memory, comprising:
a voltage converting circuit which voltage-converts a resistance difference between a first and a second resistance elements;
a voltage comparing circuit which outputs a comparison result corresponding to said resistance difference based on an output of said voltage converting circuit;
a latch circuit for holding said comparison result of said voltage comparing circuit; and
a switch circuit which cuts or connects an output side of said voltage converting circuit and an input side of said voltage comparing circuit.

2. The semiconductor memory according to claim 1, wherein: said voltage comparing circuit includes a cross couple circuit; and an output of said voltage converting circuit is connected to a cross couple node of said cross couple circuit via said switch circuit.

3. The semiconductor memory according to claim 1, wherein: said voltage converting circuit comprises MOS switches which are individually connected to both of said first and second resistance elements; and said MOS switches are controlled to flow electric currents to said both of first and second resistance elements so as to perform voltage conversion in accordance with said resistance difference between said both of first and second resistance elements.

4. The semiconductor memory according to claim 3, wherein each of said MOS switches is controlled by a first control signal which is formed with a one-shot pulse.

5. The semiconductor memory according to claim 3, further comprising a voltage level controller, wherein
a high-side voltage level of a first control signal which controls said MOS switches of said voltage converting circuit is supplied from said voltage level controller.

6. The semiconductor memory according to claim 5, wherein a voltage level generated by said voltage level controller is below a voltage level of an externally supplied power source.

7. The semiconductor memory according to claim 1, wherein said switch circuit is constituted of a MOS transistor.

8. The semiconductor memory according to claim 7, wherein said MOS transistor is controlled by said first control signal or a second control signal which is included in said first control signal.

9. The semiconductor memory according to claim 8, wherein: said voltage comparing circuit is controlled by a third control signal which is formed with a one-shot pulse; and an enable period of said third control signal has a period which overlaps with an enable period of said second control signal.

10. The semiconductor memory according to claim 9, wherein: said latch circuit is controlled by a fourth control signal which is formed with a one-shot pulse; and said fourth control signal is a signal which is obtained by converting a high-side voltage level from a first voltage level to a second voltage level and, then, is reconverted to said first voltage level in a process of generating said fourth control signal.

11. The semiconductor memory according to claim 10, wherein said first, second, third, and fourth control signals are signals which are generated according to a reading-out-action command signal inputted from outside.

12. The semiconductor memory according to claim 1, said semiconductor memory receiving supplies of two power supply voltages which are first and second power supply voltages having different voltage levels, wherein:
said first power supply voltage is a power source supplied to an IO cell; and
said second power supply voltage is a power source to be supplied to said IO cell or a power source to be applied to a logic circuit.

13. The semiconductor memory according to claim 1, comprising a structure for measuring said resistance value of said first resistance element.

14. The semiconductor memory according to claim 13, wherein: in a mode for measuring said resistance value of said first resistance element, said MOS switch is connected to said first resistance element in said voltage converting circuit and said switch circuit; and said MOS switch alone and said switch circuit are controlled to be enabled, while said voltage comparing circuit is controlled to be disabled.

15. The semiconductor memory according to claim 1, wherein said first resistance element is a silicide polysilicon resistance.

16. A semiconductor memory, comprising:
   a voltage converting circuit which voltage-converts a resistance difference between a first resistance element and a second resistance element;
   a voltage comparing circuit which outputs a comparison result corresponding to said resistance difference based on an output of said voltage converting circuit;
   a latch circuit for holding said comparison result of said voltage comparing circuit;
   a switch circuit which cuts or connects an output side of said voltage converting circuit and an input side of said voltage comparing circuit; and
   a resistance margin measuring device for measuring a resistance margin of said first resistance element.

17. The semiconductor memory according to claim 16, wherein:
   said resistance margin measuring device comprises a third and a fourth resistance elements; and
   MOS switches are individually connected to said first-said fourth resistance elements so that measurement of said resistance margin can be achieved through drive control of each of said MOS switches.

18. The semiconductor memory according to claim 17, wherein said second, third, and fourth resistance elements are constituted of an element which is formed into a same shape by a same material as those of said first resistance element, said second, third, and fourth resistance elements being disposed to be connected in series.

19. The semiconductor memory according to claim 17, wherein said second, third, and fourth resistance elements are non-silicide polysilicon resistances.

20. A semiconductor memory, comprising:
   a voltage converting circuit which voltage-converts a resistance difference between a first resistance and a second resistance elements;
   a voltage comparing circuit which outputs a comparison result corresponding to said resistance difference based on an output of said voltage converting circuit;
   a latch circuit for holding said comparison result of said voltage comparing circuit; and
   a switch circuit which cuts or connects an output side of said voltage converting circuit and an input side of said voltage comparing circuit, wherein
   said voltage converting circuit comprises:
   a first MOS switch which is connected to said first resistance element; and
   a plurality of MOS switches having different driving capacities, which are connected to said second resistance element, wherein
   said plurality of MOS switches are drive-controlled so that conversion voltage level of said second resistance element can be varied.

* * * * *